(12) United States Patent
Lee et al.

(10) Patent No.: US 6,396,754 B1
(45) Date of Patent: May 28, 2002

(54) SEMICONDUCTOR MEMORY DEVICE WHICH CONTROLS SENSE AMPLIFIER FOR DETECTING BIT LINE BRIDGE AND METHOD OF CONTROLLING THE SEMICONDUCTOR MEMORY DEVICE

(75) Inventors: Hyong-yong Lee; Suk-bae Jun; Choong-sun Park, all of Yongin (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/901,050

(22) Filed: Jul. 10, 2001

(30) Foreign Application Priority Data

Aug. 1, 2000 (KR) .............................................. 00-44578

(51) Int. Cl.$^7$ .............................................. G11C 29/00
(52) U.S. Cl. ........................ 365/201; 365/149; 365/190
(58) Field of Search ................................. 365/201, 149, 365/193, 205, 207, 208, 190

(56) References Cited

U.S. PATENT DOCUMENTS 5,748,520 A * 5/1998 Asaka et al. ................. 365/149
6,018,481 A * 1/2000 Shiratake .................... 365/190

FOREIGN PATENT DOCUMENTS

JP          7085670          3/1995

\* cited by examiner

Primary Examiner—Son Mai
(74) Attorney, Agent, or Firm—Volentine Francos, PLLC

(57) ABSTRACT

In a sense amplifier control circuit and method for a semiconductor memory device, a row address strobe (RAS) signal delay unit delays a RAS signal for a predetermined period of time. A sense amplifier control signal generator generates first and second sense amplifier control signals, responsive to the delayed RAS signal and a test mode control signal, which are enabled at the same time or at different periods depending on operation modes of the memory device. First and second sense amplifiers respectively sense and amplify the potential of odd-numbered and even-numbered bit line pairs of the memory device, responsive to the first and second sense amplifier control signals. The probability and accuracy of detecting bit line bridge defects are increased, because the times for sensing two adjacent bit lines are different.

14 Claims, 6 Drawing Sheets

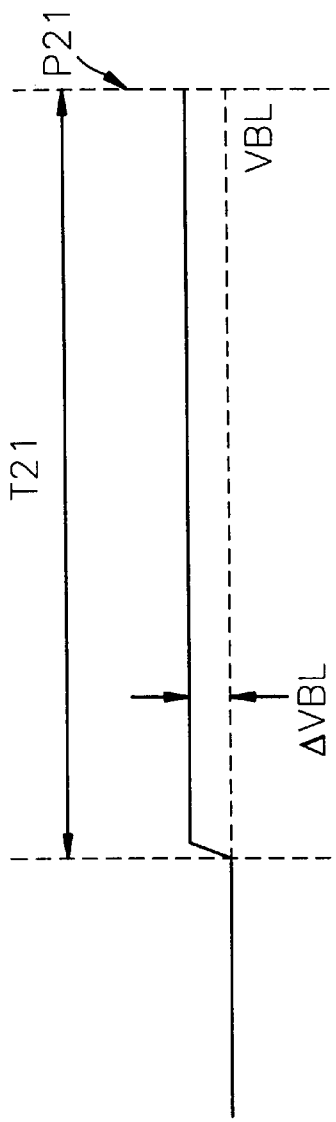
FIG. 2A
(PRIOR ART)
FIG. 2B
(PRIOR ART)
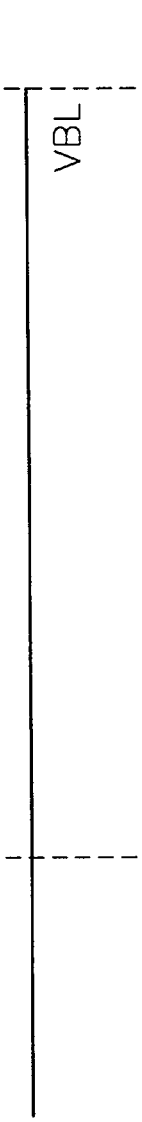
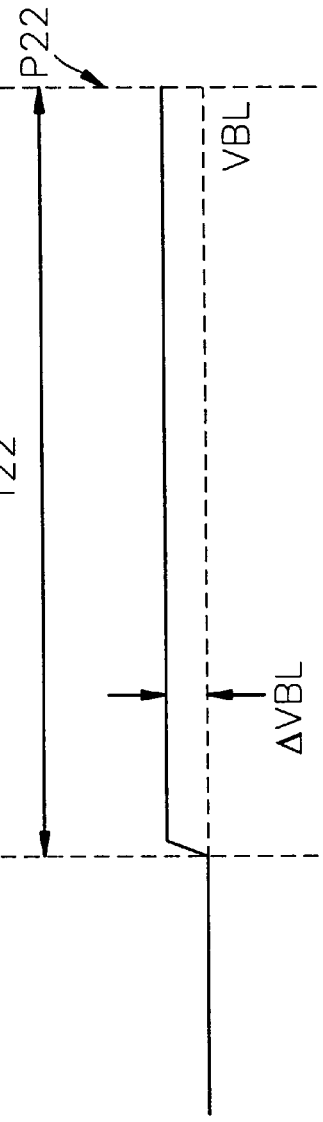
FIG. 2C
(PRIOR ART)
FIG. 2D
(PRIOR ART)

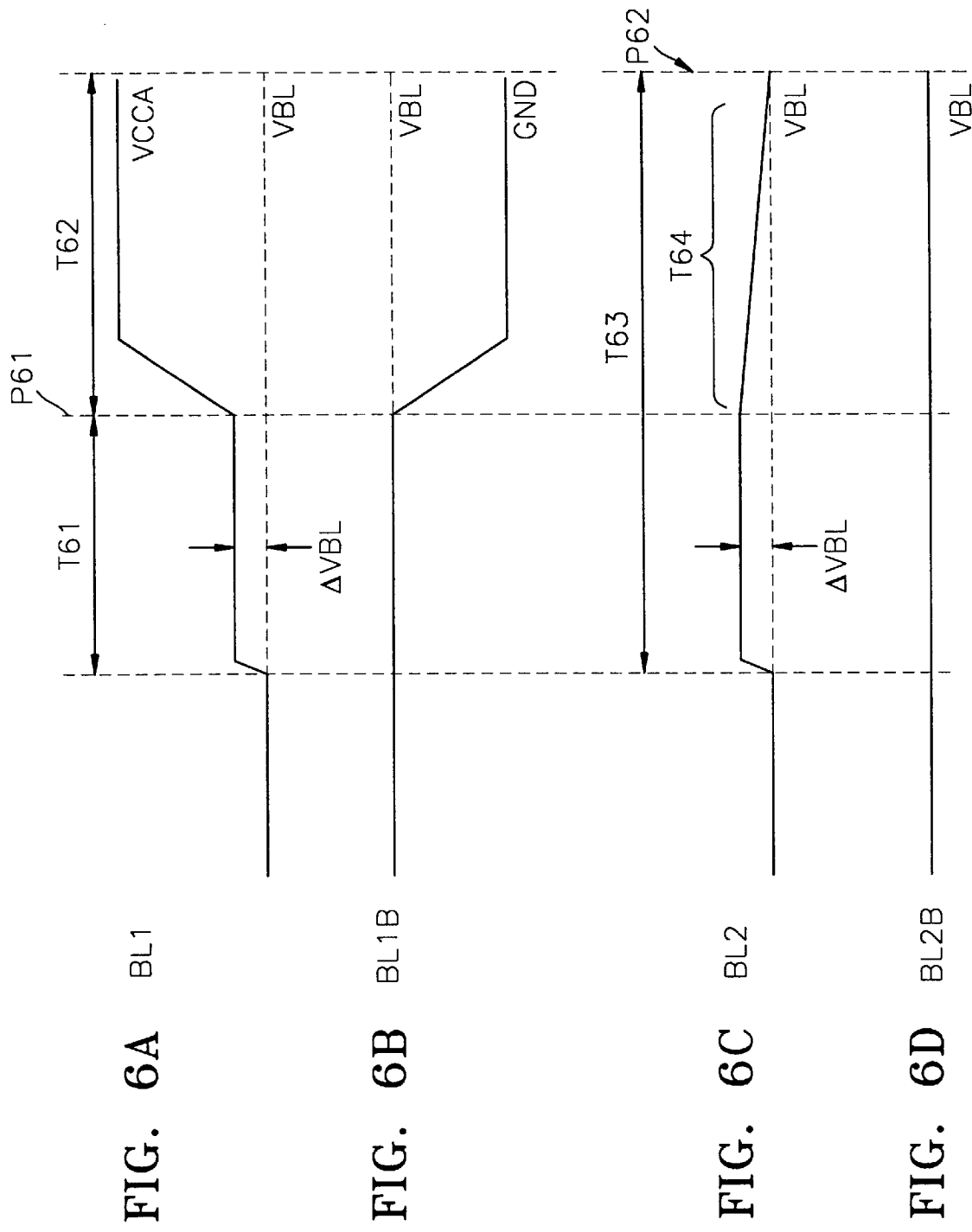

SEMICONDUCTOR MEMORY DEVICE WHICH CONTROLS SENSE AMPLIFIER FOR DETECTING BIT LINE BRIDGE AND METHOD OF CONTROLLING THE SEMICONDUCTOR MEMORY DEVICE

The present application claims priority under 35 U.S.C. §119 to Korean Patent Application No. 2000-44578 filed on Aug. 1, 2000, which is hereby incorporated by reference in its entirety for all purposes.

BACKGROUND OF THE INVENTION

1. Field of the Invention

The present invention relates to semiconductor memory devices, and more particularly, to a semiconductor memory device which controls a sense amplifier for detecting a bit line bridge, and a method of controlling a sense amplifier.

2. Description of the Related Art

Due to a recent trend toward high integration of semiconductor memory devices, more delicate processing techniques are required. However, upon high integration and refining of semiconductor memory devices, the probability of various minute defects such as a bit line bridge, increases due to related difficulties in production of memory devices. In this case, a bit line bridge refers to generation of a resistance component between bit line layers due to dust or the like.

FIG. 1 is a schematic view illustrating a bit line bridge in a conventional semiconductor memory device. Referring to FIG. 1, a memory cell MC0 is connected between a word line WL1 and a bit line BL1, and a memory cell MC2 is connected between the word line WL1 and a bit line BL2. A memory cell MC1 is connected between a word line WL2 and a complementary bit line BL1B, and a memory cell MC3 is connected between the word line WL2 and a complementary bit line BL2B. Also, a bit line sense amplifier 10 is connected to the bit line BL1 and the complementary bit line BL1B, and a bit line sense amplifier 15 is connected to the bit line BL2 and the complementary bit line BL2B. In FIG. 1, a bridge R_BR is formed between the adjacent bit lines BL1B and BL2.

During the operation of the semiconductor memory device shown in FIG. 1, the bit line bridge R_BR may cause a charge sharing margin defect. That is, bit line leakage current is generated due to the bit line bridge R_BR. Consequently, a defect in a column direction is generated due to a deficiency in the margin of a charge sharing voltage (ΔVBL) during normal reading.

The bit line leakage current can be expressed as in Equation 1:

$$IVBL_L = \Delta V \left[1 - \text{EXP}\left(-\frac{T}{RC}\right)\right] \quad (1)$$

wherein $IVBL_L$ denotes a leakage current on a bit line, $\Delta V$ denotes a difference between the voltages of both ends of the bridge, T denotes a time during which current is leaked, R denotes the resistance value of the bridge R_BR, and C denotes a bit line capacitance. That is, the bit line leakage current $IVBL_L$ is determined by the resistance R of the bridge R_BR and the time during which current is leaked. According to Equation 1, the bit line leakage current $IVBL_L$ must be compulsorily increased in order to easily detect a charge sharing margin defect due to the bit line bridge R_BR. The current leakage time T can be considered as the time during which memory cells share charge with a bit line having initial voltage VBL.

FIGS. 2A through 2D are waveform diagrams for illustrating a conventional bit line sensing operation. Referring to FIG. 2, T21 and T22 denote the charge sharing time of the bit lines BL1 and BL2, respectively, and P21 and P22 denote the points in time of driving the sense amplifiers 10 and 15, respectively. As shown in FIG. 2, in this conventional operation, the point in time of driving the sense amplifier 10 is the same as that of driving the sense amplifier 15.

When data stored in the memory cell MC2 is read, the cell transistors T11 and T13 of the memory cells MC0 and MC2 connected to the word line WL1 are turned on. Assuming that data stored in the memory cells MC0 and MC2 are at high levels, the memory cells MC0 and MC2 share charge with the bit lines BL1 and BL2 having the initial voltage VBL, whereby the voltage level of each of the bit lines BL1 and BL2 is VBL+ΔVBL (a charge sharing voltage). Each of the complementary bit lines BL1B and BL2B continuously has the initial voltage level VBL. Accordingly, a voltage ΔV between both ends of the bit line bridge resistance R_BR of FIG. 1 is the difference (ΔVBL) between the voltage (i.e., VBL+ΔVBL) of the bit line BL2 and the voltage (i.e., VBL) of the complementary bit line BL1B.

However, in a case when the bit line bridge resistance is sufficiently large, like in the case of a microbridge, the level of the voltage ΔV is small, so that the bit line leakage current $IVBL_L$ is also not so great, resulting in a deficient charge sharing margin. Thus, in the case when the bit line bridge resistance is sufficiently large, like in the case of a microbridge, even if the sense amplifiers 10 and 15 are simultaneously driven after charge sharing, the data stored in the memory cell MC2 is normally sensed because the bit line leakage current $IVBL_L$ is very small.

Accordingly, in conventional semiconductor memory devices, a defect due to a bit line bridge is detected by a method of increasing the current leakage time (T) to compulsorily increase the bit line leakage current $IVBL_L$. However, as described above, in the case that a bridge resistance is large, the amount of leakage current is very small although the current leakage time (T) is set to be long, so that defects cannot be accurately detected. Upon testing for detecting a defect of a semiconductor memory, detection of a bridge between layers becomes easier as the difference in voltage between two layers increases. Hence, this conventional method cannot be deemed to be easy in terms of voltage stress. Also, when the current leakage time (T) is artificially set to detect defects, process parameters such as the leakage current of a bit line must be considered.

SUMMARY OF THE INVENTION

The present invention is therefore directed to a method and apparatus for detecting bit line bridges, which substantially overcomes one or more of the problems due to the limitations and disadvantages of the related art.

To solve the above problems, it is an object of the present invention to provide a semiconductor memory device for controlling a sense amplifier, in which defects due to a bit line bridge can be effectively detected.

It is another object of the present invention to provide a sense amplifier controlling method performed in the semiconductor memory device.

It is still another object of the present invention to provide a bit line bridge detection method performed in the semiconductor memory device.

To achieve the first and other objects, the present invention provides a semiconductor memory device having memory cells connected to a plurality of word lines and a plurality of bit lines, the device including a row address strobe (RAS) signal delay unit, a sense amplifier control signal generator, a plurality of first sense amplifiers and a plurality of second sense amplifiers. The RAS signal delay unit delays a RAS signal for a predetermined period of time and outputs the delayed RAS signal. The sense amplifier control signal generator generates first and second sense amplifier control signals responsive to the delayed RAS signal and a test mode control signal, and which are enabled at the same time or at different periods in time depending on the operation modes of the semiconductor memory device. The first sense amplifiers sense and amplify the potential of a (2N−1)th (where N is a natural number that is equal to or greater than 1) bit line pair among the bit lines in response to the first sense amplifier control signal. The second sense amplifiers sense and amplify the potential of a 2N−th bit line pair among the bit lines in response to the second sense amplifier control signal. In the test mode, the first and second sense amplifier control signals are enabled at different points in time, so that the first and second sense amplifiers are activated at different points in time.

To achieve the second and other objects, the present invention provides a method of controlling a bit line sense amplifier in a semiconductor memory device having memory cells connected to a plurality of word lines and a plurality of bit lines, the method including steps (a) through (e). In step (a), it is determined whether the semiconductor memory device is in a test mode. In step (b), if it is determined that the semiconductor memory device is in a test mode, a first sense amplifier control signal for sensing and amplifying the potential of a (2N−1)th (where N is a natural number that is equal to or greater than 1) bit line pair is produced. In step (c), the potential of the (2N−1)th bit line pair is sensed and amplified in response to the first sense amplifier control signal. In step (d), a second sense amplifier control signal for sensing and amplifying the potential of a 2N−th bit line pair adjacent to the (2N−1)th bit line pair is produced, after the potential of the (2N−1)th bit line pair is fully sensed. In step (e), the potential of the 2N−th bit line pair is sensed and amplified in response to the second sense amplifier control signal.

To achieve the third and other objects, the present invention provides a method of detecting a bit line defect in a semiconductor memory device having memory cells connected to a plurality of word lines and a plurality of bit lines, the method includes steps (a) through (f). In step (a), it is determined whether the semiconductor memory device is in a test mode. In step (b), a first sense amplifier control signal for sensing the potential of a (2N−1)th (where N is a natural number that is equal to or greater than 1) bit line pair so that the (2N−1)th bit line pair is sensed prior to an adjacent 2N−th bit line pair is produced, if it is determined that the semiconductor memory device is in a test mode. In step (c), the potential of the (2N−1)th bit line pair is fully sensed in response to the first sense amplifier control signal. In step (d), it is determined whether a charge sharing margin is reduced during charge sharing of the 2N−th bit line pair. In step (e), it is judged that a bit line bridge defect is generated, if it is determined that the charge sharing margin of the 2N−th bit line pair is reduced. In step (f), it is judged that no bit line bridge defects are generated, if it is determined that the charge sharing margin of the 2N−th bit line pair is not reduced.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and Wherein:

FIGS. 2A through 2D are waveform views for illustrating a bit line sensing operation of a conventional semiconductor memory device;

FIGS. 6A through 6D are waveform views for illustrating the bit line sensing operation of the circuit shown in FIG. 3.

DESCRIPTION OF THE PREFERRED EMBODIMENTS

Figure 1:
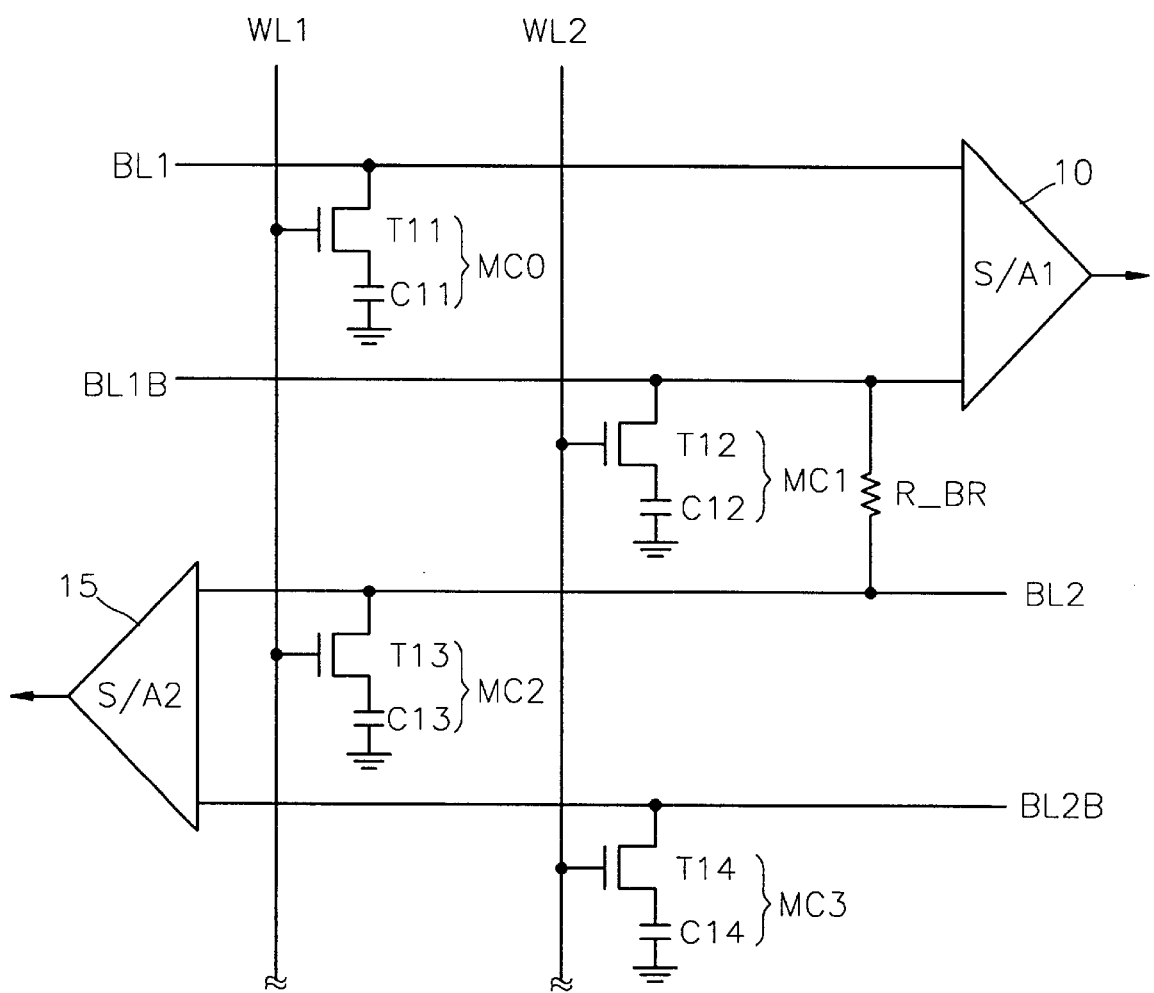
FIG. 1 is a schematic diagram for illustrating a bit line bridge in a general semiconductor memory device.
Figure 3:
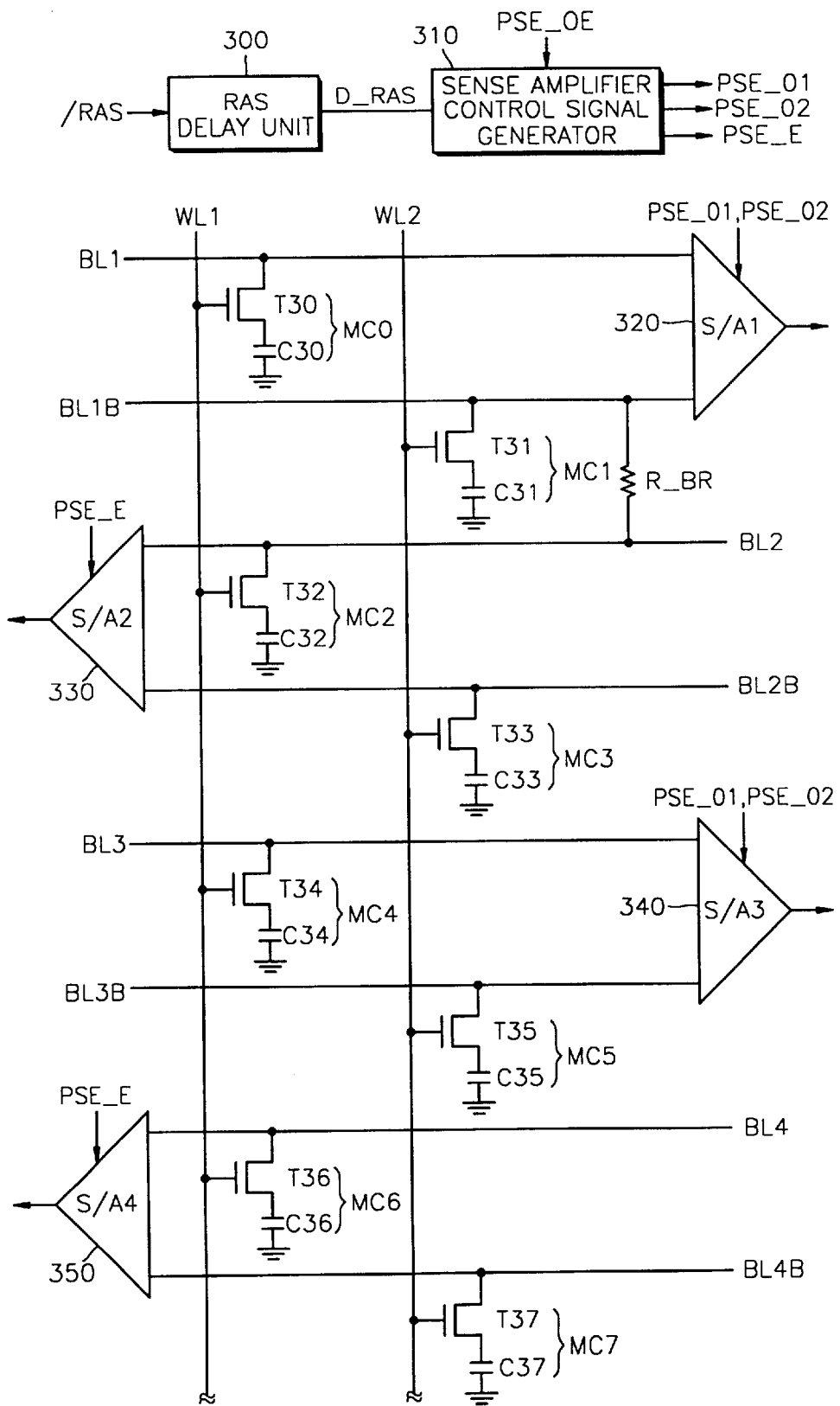
FIG. 3 illustrates a semiconductor memory device which controls a sense amplifier to detect a bit line bridge, according to an embodiment of the present invention.

Referring to FIG. 3, a semiconductor memory device for controlling a sense amplifier, according to an embodiment of the present invention, includes a row address strobe (RAS) delay unit 300, a sense amplifier control signal generator 310, sense amplifiers 320, 330, 340 and 350 and a memory cell array. The RAS delay unit 300 is an RAS chain circuit in which a plurality of inverters are connected to each other in series. The RAS delay unit 300 delays a row address strobe signal /RAS for a predetermined period of time to obtain a delayed RAS signal D__RAS. Here, the output of the RAS delay unit 300 can be a signal obtained by inverting the RAS signal /RAS.

The sense amplifier control signal generator 310 generates first and second sense amplifier control signals in response to the delayed RAS signal D__RAS and a test mode control signal PSE__0E, and are enabled simultaneously or at different points in time depending on the type of an operation mode of a semiconductor memory device. Here, the test mode control signal PSE__0E, which is enabled to a predetermined level, for example, at a high level, in a test mode, can be designated by mode setting. The first sense amplifier control signal is divided into $PSE_{13}\,01$ and PSE__02 according to an operation mode, and the second sense amplifier control signal is defined as PSE__E. That is, the first sense amplifier control signals PSE__01 and PSE__02 sense odd-numbered bit line pairs (BL1/BL1B, BL3/BL3B, . . . ). Here, PSE__01 is a sense amplifier control signal for sensing odd-numbered bit line pairs (BL1/BL1B, BL3/BL3B, . . . ) in the test mode of a semiconductor memory device, and PSE__02 is a sense amplifier control signal for sensing odd-numbered bit line pairs (BL1/BL1B, BL3/BL3B, . . . ) in the normal operation mode of a semiconductor memory device. The second sense amplifier control signal PSE__E senses even-numbered bit line pairs (BL2/BL2B, BL4/BL4B, . . . ).

In the present invention, the even-numbered (2N, where N is a natural number that is equal to or greater than 1) bit line pairs adjacent to the odd-numbered (2N−1) bit line pairs are sensed at a point in time when the odd-numbered bit line pairs are fully sensed, in a test mode. Also, a sense amplifier control signal for sensing even-numbered bit line pairs can be divided according to the operation modes of a semiconductor memory device, by design. As described above, in the present invention, adjacent bit line pairs are sensed at different points in time in a test mode in order to increase the potential difference ΔV between both ends of a bridge resistance R_BR, to increase the above-described bit line leakage current.

The memory cell array of FIG. 3 includes a plurality of memory cells connected between word lines and bit lines. To be more specific, a memory cell MC0 is connected between a word line WL1 and a bit line BL1, and a memory cell MC1 is connected between a word line WL2 and a complementary bit line BL1B. A memory cell MC2 is connected between the word line WL1 and the bit line BL2, and a memory cell MC3 is connected between the word line WL2 and its complementary bit line BL2B. In this way, other memory cells are connected between word lines and bit lines. As shown in FIG. 3, each of the memory cells (MC0, MC1, . . . ) is made up of a cell transistor and a cell capacitor.

In FIG. 3, a bit line sense amplifier (S/A1) 320 senses and amplifies the potential difference between a pair of the bit lines BL1 and BL1B in response to the first sense amplifier control signal PSE_01 or PSE_02 generated by the sense amplifier control signal generator 310. That is, in a normal operation mode, the bit line sense amplifier (S/A1) 320 is driven by the first sense amplifier control signal PSE_02 and senses the potential on the bit line pair BL1 and BL1B. In a test mode for detecting a bit line bridge, the bit line sense amplifier (S/A1) 320 is driven by the first sense amplifier control signal PSE_01 and senses the potential on the bit line pair BL1 and BL1B. In FIG. 3, it is assumed that a bit line bridge resistance R_BR is formed between the complementary bit line BL1B and the bit line BL2 adjacent thereto.

Referring to FIG. 3, the bit line sense amplifier 330 is driven in response to the second sense amplifier control signal PSE$_{13}$ E generated by the sense amplifier control signal generator 310, and senses and amplifies the potential difference between the bit line pair BL2 and BL2B. That is, the bit line sense amplifier (S/A2) 330 is driven at the same point in time in the test mode and in the normal operation mode. Also, in the normal operation mode, the bit line sense amplifier (S/A2) 330 is driven at the same point in time the bit line sense amplifier (S/A1) 320 is driven. As described above, the bit line sense amplifiers (S/A2, S/A4, . . . ) 330, 350, . . . for sensing and amplifying the potential difference between even-numbered bit line pairs are driven in response to the second sense amplifier control signal PSE_E.

Figure 4:
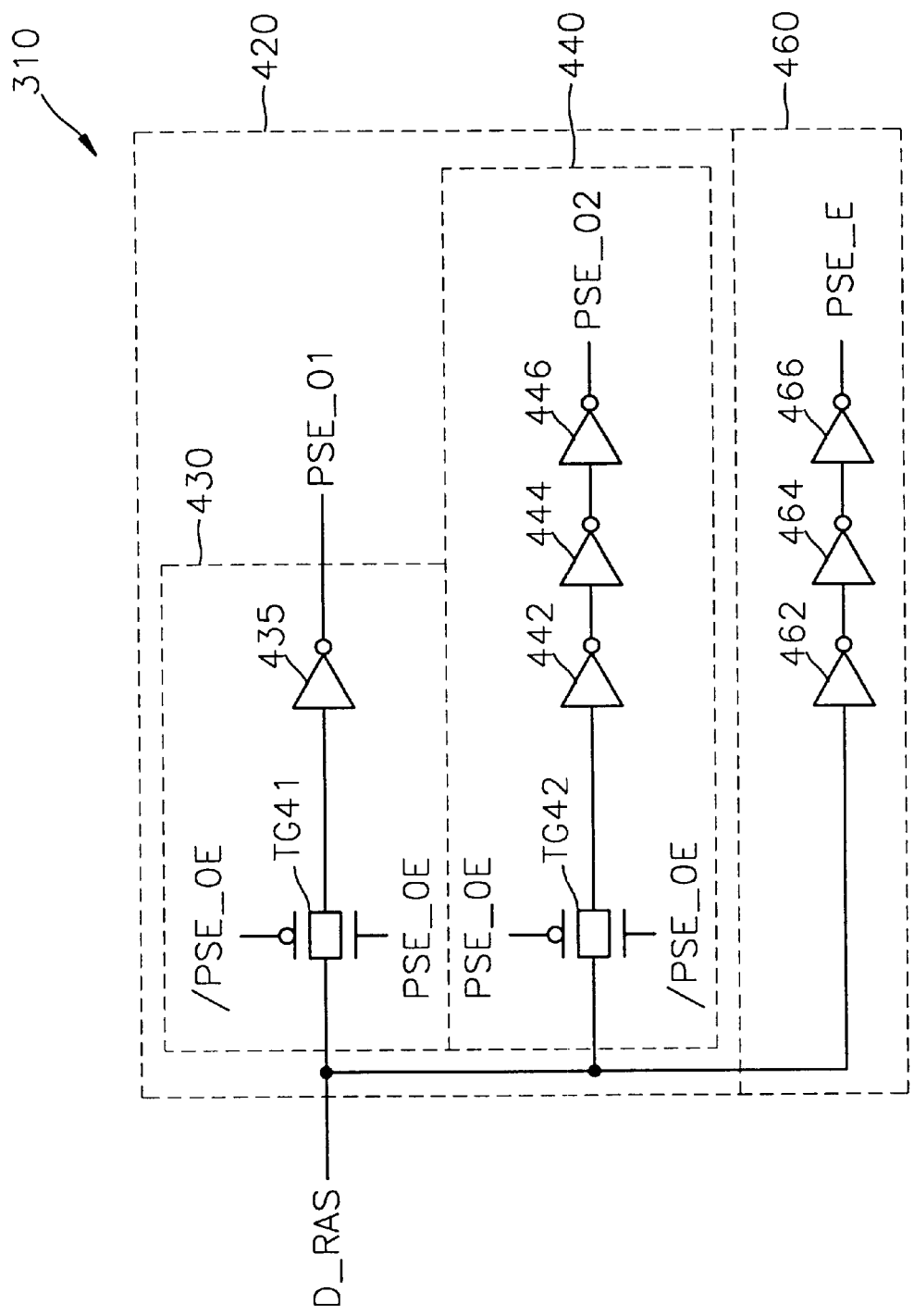
FIG. 4 is a detailed circuit diagram for illustrating the sense amplifier control signal generator shown in FIG. 3.

FIG. 4 is a detailed circuit diagram of the sense amplifier control signal generator 310 shown in FIG. 3. Referring to FIG. 4, the sense amplifier control signal generator 310 includes first and second control signal generation units 420 and 460. Here, the first control signal generation unit 420 generates the first sense amplifier control signals PSE_01 and PSE_02 for sensing odd-numbered bit line pairs, and the second control signal generation unit 460 generates the second sense amplifier control signal PSE_E for sensing even-numbered bit line pairs.

Also, the first control signal generation unit 420 is made up of first and second generation units 430 and 440. The first generation unit 430 includes a transmission gate TG41, which serves as a switching device, and an inverter 435 which serves as a delay unit. The transmission gate TG41 transmits the delayed RAS signal D_RAS in response to a test mode control signal PSE_0E and an inverted test mode control signal PSE_0E. The inverter 435 inverts the delayed RAS signal D_RAS to obtain the first sense amplifier control signal PSE_01 for the test mode.

The second generation unit 440 includes a transmission gate TG42 to serve as a switching device, and serially-connected inverters 442, 444 and 446 to serve as delay units. The transmission gate TG42 transmits the delayed RAS signal D_RAS in response to the test mode control signal PSE_0E and its inverted test mode control signal /PSE_0E. The inverters 442, 444 and 446 invert and delay the delayed RAS signal D_RAS for predetermined periods of time to obtain the first sense amplifier control signal PSE_02 for the normal operation mode.

The second sense amplifier control signal generation unit 460 includes serially-connected inverters 462, 464 and 466 to serve as delay units. That is, the second sense amplifier control signal generation unit 460 inverts and delays the delayed RAS signal D_RAS in the normal operation mode or the test mode to obtain the second sense amplifier control signal PSE_E. That is, it is preferable that the time required to enable the signal PSE_E after the signal PSE_01 is generated is set to be such a time as to sufficiently sense a bit line pair connected to a bit line sense amplifier that operates in response to the signal PSE_01.

The operation of the sense amplifier control signal generator 310 shown in FIG. 4 will now be described. First, in the case of the normal operation mode, the test mode control signal PSE_0E is set to have a low level, whereas the inverted test mode control signal /PSE_0E is set to have a high level. At this time, the test mode control signal PSE_E is in a non-activated state. Thus, the transmission gate TG42 in the second generation unit 440 is turned on to transmit the delayed RAS signal D_RAS, while the transmission gate TG41 in the first generation unit 430 is not turned on. That is, the delayed RAS signal D_RAS received via the transmission gate TG42 is further delayed for a predetermined period of time by the inverters 442, 444 and 446 and output as the first sense amplifier control signal PSE_02. Also, the delayed RAS signal D_RAS from the RAS delay unit 300 is further delayed by the inverters 462, 464 and 466 and output as the second sense amplifier control signal PSE_E. Accordingly, the bit line sense amplifiers 320 and 340 for sensing the potential difference between odd-numbered bit line pairs are driven at the same point in time the bit line sense amplifiers 330 and 350 for sensing the potential difference between even-numbered bit line pairs are driven.

Meanwhile, in the test mode for detecting a bit line defect, the test mode control signal PSE_0E is activated to a high level, whereas the inverted test mode control signal /PSE_0E is at a low level. Thus, the transmission gate TG41 in the first generation unit 430 is turned on to transmit the delayed RAS signal D_RAS, while the transmission gate TG42 in the second generation unit 440 is not turned on. The output of the transmission gate TG41 is inverted by the inverter 435 and output as the first sense amplifier control signal PSE_01. Accordingly, in the test mode, the first and second sense amplifier control signals PSE_01 and PSE_E are enabled at different points in time. Thus, the sensing points in time of adjacent bit line pairs are different due to the difference between the points in time when the signals PSE_01 and PSE_E are enabled, respectively. That is, the bit line sense amplifiers 320 and 340 for sensing the potential difference between odd-numbered bit line pairs, and the bit line sense amplifiers 330 and 350 for sensing the potential difference between even-numbered bit line pairs adjacent to the odd-numbered bit line pairs, are driven at different points in time.

Figure 5:
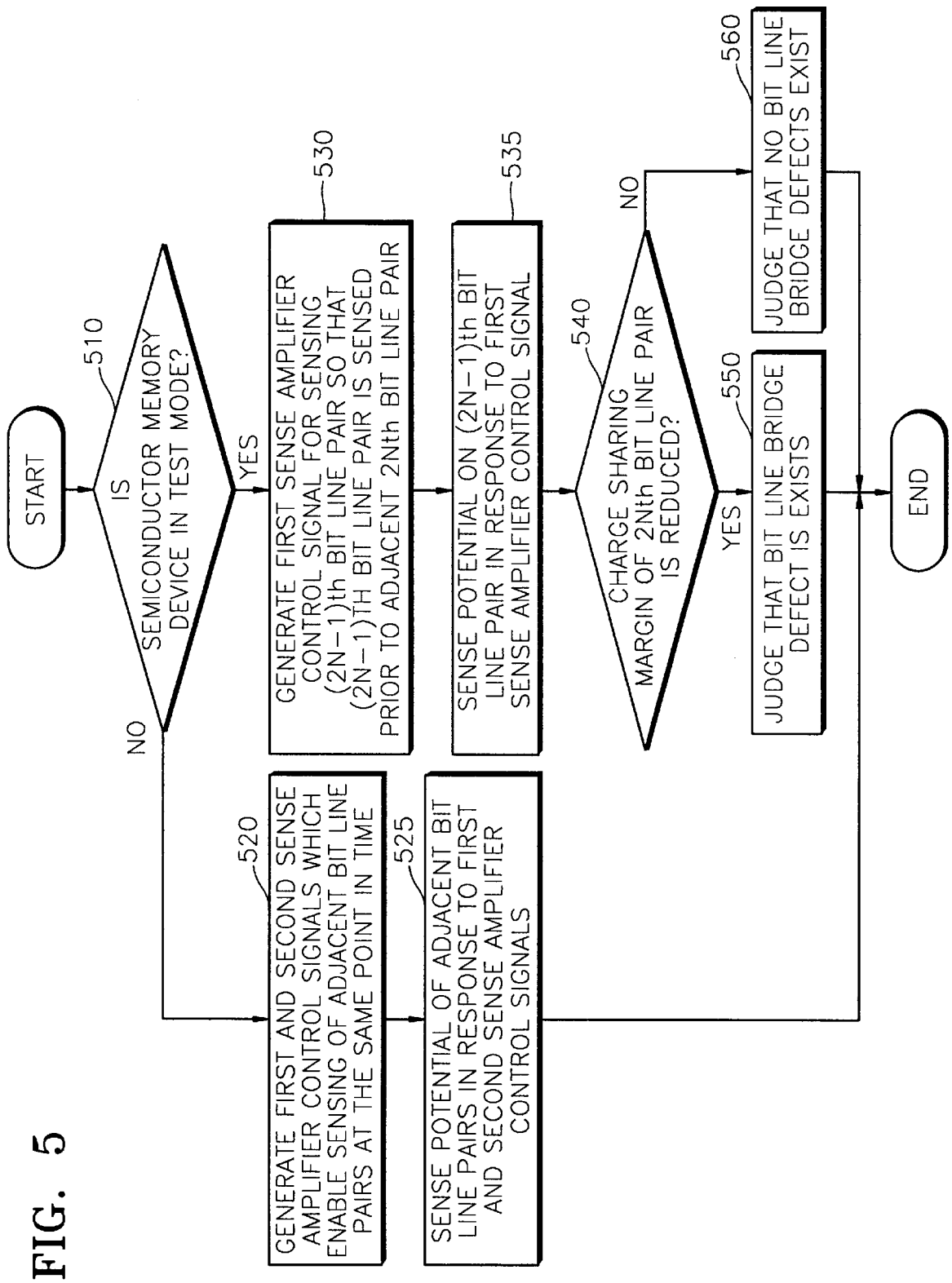
FIG. 5 is a flowchart for illustrating a sense amplifier control method and a bit line bridge detection method which are performed in the device shown in FIG. 3.

FIG. 5 is a flowchart for illustrating a sense amplifier control method and a bit line defect (bridge) detection method based on the sense amplifier control method for the semiconductor memory device shown in FIG. 3.

FIGS. 6A through 6D are waveform diagrams for illustrating the bit line sensing operation of the semiconductor memory device shown in FIG. 3. FIGS. 6A and 6B represent potential on a bit line pair BL1 and BL1B, respectively, and FIGS. 6C and 6D represent potential on a bit line pair BL2 and BL2B, respectively, that is adjacent to the bit line pair BL1 and BL1B. The other bit line pairs, for example, BL3, BL4 and the like, are not shown since the relationship between the BL1 and BL2 can be equally applied to them.

A sense amplifier control method and a bit line defect detection method based on the sense amplifier control method for a semiconductor memory device according to the present invention will now be described in detail with reference to FIGS. 3 through 6. First, a determination is made as to whether a semiconductor memory device is in a test mode or in a normal mode, in step 510. If the semiconductor memory device has entered the test mode for detecting a bit line defect, the first sense amplifier control signal PSE__01 for sensing an odd-numbered (2N−1) bit line pair is generated to sense the odd-numbered (2N−1) bit line pair prior to an adjacent even-numbered (2N) bit line pair, in step 530. Processes for generating the sense amplifier control signals PSE__01, PSE__02 and PSE__E are as previously described in detail with reference to FIG. 4.

In the present invention, if a particular cell in the memory cell array of FIG. 3 is accessed to read data from the particular cell, all bit line sense amplifiers on bit lines connected to an enabled word line are driven not simultaneously, but at different points in time. Referring to FIG. 3, in order to read cell data from the memory cell MC2, first, the word line WL1 is enabled. The cell data stored in each of the memory cells (MC0, MC2, MC4, . . . ) are assumed to be "1", that is, high-level data. At this time, the cell transistors (T30, T32, T34, T36, . . . ) in the memory cells (MC0, MC2, MC4, MC6, . . . ) connected to the enabled word line WL1 are turned on. Hence, each of the bit lines (BL1, BL2, BL3, BL4, . . . ) connected to the enabled word line WL1 maintains a VBL level at first, and then charge shares with cell data of a high level stored in each of the memory cells when the cell transistors (T30, T32, T34, T36, . . . ) are turned on, whereby the level of each of the bit lines (BL1, BL2, BL3, BL4, . . . ) is increased by ΔVBL. At this time, the complementary bit lines (BL1B, BL2B, BL3B, BL4B, . . . ) maintain the voltage level VBL without change. Referring to FIGS. 6A and 6C, T61 denotes an interval where the bit line BL1 shares charge, and T63 denotes an interval where the bit line BL2 shares charge. As described above, the voltage level of each of the bit lines BL1 and BL2 is VBL+ΔVBL at first.

When the first sense amplifier control signal PSE__01 is enabled in step 530, the potential of each odd-numbered bit line pair is sensed in response to the enabled first sense amplifier control signal PSE__01, in step 535. Here, if a bit line bridge R__BR exists between adjacent bit lines, the leakage current between the bit lines increases. To be more specific, when the sense amplifiers (S/A1) and (S/A3) 320 and 340 are driven in response to the first sense amplifier control signal PSE__01, they sense and amplify the potential difference between a pair of bit lines BL1 and BL1B and that between a pair of bit lines BL3 and BL3B, respectively. Referring to FIGS. 6A and 6B, the voltage levels of the bit line BL1 and the complementary bit line BL1B are sensed at a point in time (P61), and the voltage difference therebetween develops, or in other words is thereafter amplified. Hence, as shown in FIG. 6A, the voltage of the bit line BL1 is increased to the voltage level of cell data, that is, a power supply voltage level (VCCA), while the voltage of the complementary bit line BL1B is decreased to a ground potential GND, on the assumption that the potential of a bit line pair BL1 and BL1B has been fully sensed. However, as shown in FIG. 6C, since the second sense amplifier control signal PSE__E has not yet been enabled, the voltage of the bit line BL2 still has the voltage level VBL+ΔVBL. It can be seen that the potential difference ΔV between both ends of the bit line bridge resistance R__BR in the present invention can be obtained according to Equation 2:

$$\Delta V = VGND - (VBL + \Delta VBL) \tag{2}$$

It can be seen from Equation 2 that the level of ΔV in the present invention is higher than the conventional ΔV, which is ΔVBL. Thus, the bit line leakage current $IVBL_L$ in the present invention increases compared to the conventional counterpart shown in Equation 1.

At this time, it is determined according to the leakage current $IVBL_L$ whether a charge sharing margin ΔVBL is reduced during charge sharing of adjacent even-numbered bit lines BL2 and BL2B, in step 540. That is, if the leakage current $IVBL_L$ of a bit line having bridge resistance R__BR is large, the charge sharing margin ΔVBL of adjacent bit lines BL2 and BL2B is reduced. Accordingly, if it is determined in step 540 that the charge sharing margin of even-numbered bit lines BL2 and BL2B is reduced based on the leakage current $IVBL_L$, it is judged that a bit line bridge defect exists in step 550. Referring to FIG. 6C, it can be seen that the charge sharing margin is reduced if the bit line bridge R__BR exists between adjacent bit lines, as shown in interval T64. If it is determined in step 540 that the charge sharing margin is not reduced, it is judged that no bit line bridge defects exist in step 560. Also, referring to FIG. 6C, when the second sense amplifier control signal PSE__E is enabled at the point in time designated by reference character P62, the potential on even-numbered bit line pairs (for example, BL2 and BL2B) is sensed in response to the second sense amplifier control signal PSE__E.

Meanwhile, if it is determined in step 510 that the semiconductor memory device is not in the test mode, first and second sense amplifier control signals PSE__02 and PSE__E, which are enabled on adjacent bit line pairs at the same point in time, are generated in step 520. Thus, the potentials on adjacent bit line pairs are sensed in response to the first and second sense amplifier control signals PSE__02 and PSE__E which are enabled at the same period in time, in step 525. Processes for charge-sharing and sensing the bit line pairs have already been described in the above and are well-known to one of ordinary skill in the art, so will not be described in detail.

As described above, even though the resistance value of a bit line bridge is set to be high such as in the case of a micro bridge, the probability of detecting a bit line bridge defect can be increased by sensing two adjacent bit lines at different times. Thus, according to the present invention, a bit line bridge defect can be more accurately detected, and the probability of detecting the bit line bridge defect can be increased, by making the times for sensing two adjacent bit lines different.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor memory device having memory cells connected to a plurality of word lines and a plurality of bit lines, comprising:

a row address strobe (RAS) signal delay unit that delays a row address strobe (RAS) signal for a period of time and outputs the delayed RAS signal;

a sense amplifier control signal generator that generates first and second sense amplifier control signals, responsive to the delayed RAS signal and a test mode control signal, the first and second sense amplifier control signals being enabled concurrently and at respectively different times depending on an operation mode of the semiconductor memory device;

plurality of first sense amplifiers that sense and amplify potential of a (2N−1)th bit line pair of the semiconductor memory device responsive to the first sense amplifier control signal, wherein N is a natural number equal to or greater than 1; and a plurality of second sense amplifiers that sense and amplify potential of a 2Nth bit line pair of the semiconductor memory device responsive to the second sense amplifier control signal, wherein during a test mode, the first and second sense amplifier control signals are enabled at the respectively different times, so that the first and second sense amplifiers are activated at different times.

2. The semiconductor memory device of claim 1, wherein during the test mode, the first and second sense amplifier control signals are generated so that the (2N−1)th bit line pair is fully sensed prior to sensing of the 2Nth bit line pair adjacent thereto.

3. The semiconductor memory device of claim 1, wherein the sense amplifier control signal generator comprises:

a first control signal generation unit that generates the first sense amplifier control signal responsive to the delayed RAS signal and the test mode control signal; and a second control signal generation unit that delays the delayed RAS signal for a first period of time to provide the second sense amplifier control signal.

4. The semiconductor memory device of claim 3, wherein the first control signal generation unit comprises:

a first generation unit that delays the delayed RAS signal for a second period of time when the test mode control signal is activated, to provide the first sense amplifier control signal; and a second generation unit that delays the delayed RAS signal for the first period of time when the test mode control signal is inactive, to provide the first sense amplifier control signal, wherein the first period of time is longer than the second period of time.

5. A method of controlling a bit line sense amplifier of a semiconductor memory device having memory cells connected to a plurality of word lines and a plurality of bit lines, comprising:

determining whether the semiconductor memory device is in a test mode;

producing a first sense amplifier control signal upon determination during said determining that the semiconductor memory device is in the test mode;

sensing and amplifying a potential of a (2N−1)th bit line pair of the semiconductor memory device responsive to the first sense amplifier control signal, wherein N is a natural number that is equal to or greater than 1;

producing a second sense amplifier control signal, after the potential of the (2N−1)th bit line pair is fully sensed; and sensing and amplifying a potential of a 2Nth bit line pair of the semiconductor memory device that is adjacent to the (2N−1)th bit line pair, responsive to the second sense amplifier control signal.

6. The method of claim 5, further comprising delaying a row address strobe (RAS) signal, said producing a first sense amplifier control signal comprising producing the first sense amplifier control signal responsive to the delayed RAS signal and an external test mode control signal.

7. The method of claim 5, further comprising producing the first and second sense amplifier control signals for the (2N−1)th bit line pair and the adjacent 2Nth bit line pair at the same time, upon determination during said determining that the semiconductor memory device is in a normal operation mode.

8. A method of detecting a bit line defect in a semiconductor memory device having memory cells connected to a plurality of word lines and a plurality of bit lines, comprising:

determining whether the semiconductor memory device is in a test mode;

producing a first sense amplifier control signal, upon determination during said test mode determining that the semiconductor memory device is in a test mode;

fully sensing a potential of a (2N−1)th bit line pair of the semiconductor memory device prior to sensing a potential of an adjacent 2Nth bit line pair, responsive to the first sense amplifier control signal, wherein N is a natural number equal to or greater than 1;

determining whether a charge sharing margin of the 2Nth bit line pair is reduced during charge sharing of the 2Nth bit line pair;

identifying that a bit line bridge defect exists, upon determination during said charge sharing margin determining that the charge sharing margin of the 2Nth bit line pair is reduced; and identifying that no bit line bridge defects exist, upon determination during said charge sharing margin determining that the charge sharing margin of the 2Nth bit line pair is not reduced.

9. The method of claim 8, further comprising delaying a row address strobe (RAS) signal, said producing a first sense amplifier control signal comprising producing the first sense amplifier control signal responsive to the delayed RAS signal and an external test mode control signal.

10. The method of claim 8, further comprising producing a second sense amplifier control signal, so that the potential of the 2Nth bit line pair is sensed after the potential of the (2N−1)th bit line pair is fully sensed.

11. A method of detecting a bit line defect in a semiconductor memory device having memory cells connected to a plurality of bit lines and a plurality of row lines, comprising:

sensing a potential of a (2N−1)th bit line pair of the semiconductor memory device, wherein N is a natural number equal to or greater than 1;

sensing a potential of a 2Nth bit line pair adjacent to the (2N−1)th bit line pair, after the potential of the (2N−1)th bit line pair is fully sensed;

determining a charge sharing margin of the 2Nth bit line pair based on the sensed potential of the 2Nth bit line pair; and identifying existence of a bit line defect based on the determined charge sharing margin.

12. The method of claim 11, wherein said identifying comprises identifying that a bit line defect exists if the determined charge sharing margin is reduced to be lower than a reference margin.

13. The method of claim 11, wherein said identifying comprises identifying that a bit line defect does not exist if the determined charge sharing margin is not reduced to be lower than a reference margin.

14. The method of claim 11, wherein the bit line defect is a bit line bridge.

* * * * *